United States Patent
Shin et al.

(10) Patent No.: US 10,466,902 B2
(45) Date of Patent: Nov. 5, 2019

(54) MEMORY SYSTEM AND OPERATION METHOD FOR THE SAME

(71) Applicant: SK hynix Inc., Gyeonggi-do (KR)

(72) Inventors: Woong-Sik Shin, Seoul (KR); Jeong-Ho Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 411 days.

(21) Appl. No.: 15/460,407

(22) Filed: Mar. 16, 2017

(65) Prior Publication Data

US 2018/0018091 A1    Jan. 18, 2018

(30) Foreign Application Priority Data

Jul. 18, 2016    (KR) .................. 10-2016-0090816

(51) Int. Cl.
| | |
|---|---|
| G06F 3/06 | (2006.01) |
| G06F 12/02 | (2006.01) |
| G11C 16/04 | (2006.01) |
| G11C 16/16 | (2006.01) |
| G11C 16/26 | (2006.01) |
| G11C 16/34 | (2006.01) |

(52) U.S. Cl.
CPC .......... *G06F 3/061* (2013.01); *G06F 3/0665* (2013.01); *G06F 3/0688* (2013.01); *G06F 12/0246* (2013.01); *G11C 16/0483* (2013.01); *G11C 16/16* (2013.01); *G11C 16/26* (2013.01); *G11C 16/349* (2013.01); *G11C 16/3495* (2013.01); *G06F 2212/7211* (2013.01)

(58) Field of Classification Search
CPC ..... G06F 12/0246–0276; G06F 2212/70–7211
See application file for complete search history.

(56) References Cited

U.S. PATENT DOCUMENTS

| | | | |
|---|---|---|---|
| 2009/0168525 A1* | 7/2009 | Olbrich | G06F 13/1657 365/185.11 |
| 2010/0228940 A1* | 9/2010 | Asnaashari | G06F 12/0246 711/170 |
| 2012/0047409 A1* | 2/2012 | Post | G06F 11/1048 714/718 |
| 2013/0151754 A1 | 6/2013 | Post et al. | |
| 2013/0173954 A1 | 7/2013 | Woo et al. | |
| 2015/0380110 A1* | 12/2015 | Tamura | G06F 11/1076 711/103 |

* cited by examiner

*Primary Examiner* — Nicholas J Simonetti
(74) *Attorney, Agent, or Firm* — IP & T Group LLP

(57) ABSTRACT

A memory system includes a memory device including a plurality of memory arrays, each of which includes a plurality of memory blocks, and a controller suitable for setting super blocks each including respective memory blocks that belong to two or more memory arrays among the plurality of the memory arrays and performing a garbage collection operation on the super blocks based on a valid page information and a wearing level of each super block.

16 Claims, 10 Drawing Sheets

MEMORY SYSTEM AND OPERATION METHOD FOR THE SAME

CROSS-REFERENCE TO RELATED APPLICATIONS

The present application claims priority under 35 U.S.C. 119(a) to Korean Patent Application No. 10-2016-0090816, filed on Jul. 18, 2016, which is incorporated herein by reference in its entirety.

BACKGROUND

1. Field

Exemplary embodiments of the present invention relate to a memory system including a non-volatile memory device, and more particularly, to a memory system that performs a garbage collection operation on a non-volatile memory device, and a method for operating the memory system.

2. Description of the Related Art

The computer environment paradigm has shifted to ubiquitous computing systems that can be used anytime and anywhere. Due to this, use of portable electronic devices such as mobile phones, digital cameras, and notebook computers has rapidly increased. These portable electronic devices generally use a memory system having one or more memory devices as a data storage device. The memory system may be used as a main memory or an auxiliary memory of a portable electronic device.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Embodiments of the present invention are directed to a memory system that may achieve wear-leveling in consideration of the extent of wearing, which is a wearing level, of the regions in a memory device when a garbage collection operation is performed in the memory device, and a method for operating the memory system.

In accordance with an embodiment of the present invention, a memory system includes: a memory device including a plurality of memory arrays, each of which includes a plurality of memory blocks; and a controller suitable for setting super blocks each including respective memory blocks that belong to two or more memory arrays among the plurality of the memory arrays and performing a garbage collection operation on the super blocks based on a valid page information and a wearing level of each super block.

The valid page information of each super block may include the number of valid pages and the wearing level of each super block may be based on the number of bad blocks included in the super blocks, respectively.

The controller may perform the garbage collection operation on the super blocks by counting pages of the bad blocks as valid pages.

The controller may perform the garbage collection operation by assigning a weight to the number of the bad blocks to produce a weighted number of the bad blocks, adding the number of the valid pages to the weighted number of the bad blocks, and selecting a super block having a smallest sum value among the added results as a victim block.

The weight may represent the total number of pages that are included in each of the bad blocks.

The controller may disable a super block that includes bad blocks more than a threshold number based on the number of the bad blocks.

The controller may adjust the weight based on the threshold number.

The controller may simultaneously erase data of memory blocks included in each of the super blocks, and simultaneously write data in respective pages the memory blocks or simultaneously read data from the respective pages.

Each of the super blocks may include memory blocks that are positioned at the same physical block positions in the more than two different memory arrays.

The plurality of the memory arrays may correspond to memory dies that are included in different memory chips.

In accordance with another embodiment of the present invention, a memory device including a plurality of memory arrays, each of which includes a plurality of memory blocks; and a controller suitable for generating valid page information and bad block information for super blocks, each of which includes respective memory blocks that belong to two or more memory arrays among the plurality of the memory arrays, and determining reference values that are used for selecting a victim block for a garbage collection operation among the super blocks based on the valid page information and the bad block information.

The controller may generate the valid page information and the bad block information by counting the number of valid pages and the number of bad blocks that are included in the super blocks, respectively.

The controller may determines the reference values by assigning a weight to the counted number of the bad blocks so as to produce a weighted number of the bad blocks, and adding the counted number of the valid pages to the weighted number of the bad blocks.

The weight may represent the total number of pages that are included in each of the bad blocks.

The controller may determine an empty space of the memory device, and when the empty space is smaller than a threshold value, the controller may compare the reference values, select a super block having a smallest reference value among the reference values as the victim block, and perform the garbage collection operation on the victim block.

The controller may determine the empty space of the memory device by counting the number of free memory blocks that are available for storing new data in the memory device.

The controller may perform the garbage collection operation by copying and storing data that are stored in valid pages of the victim block into free memory blocks in the memory device and erasing data that are stored in the victim block.

The controller may read data from the memory blocks, detect an error that occurs in the read data, and decide bad blocks based on the detected error.

In accordance with yet another embodiment of the present invention, a method for operating a memory system includes: generating valid page information and bad block information of super blocks, each of which includes respective memory blocks that belong to different memory arrays; determining reference values that are used for selecting a victim block for a garbage collection operation among the super blocks based on the valid page information and the bad block information; and performing the garbage collection operation on the super blocks based on the reference values.

The generating of the valid page information and the bad block information of the super blocks may include counting the number of valid pages and the number of bad blocks that are included in the super blocks, respectively, and wherein the determining of the reference values may include: assigning a weight to the counted number of the bad blocks so as to produce a weighted number of the bad blocks; and determining the reference values by adding the counted number of the valid pages to the weighted number of the bad blocks.

BRIEF DESCRIPTION OF THE DRAWINGS

These and other features and advantages will become apparent to those skilled in the art to which the present invention pertains from the following detailed description of the present invention in reference to the accompanying drawings, wherein.

DETAILED DESCRIPTION

Figure 1:
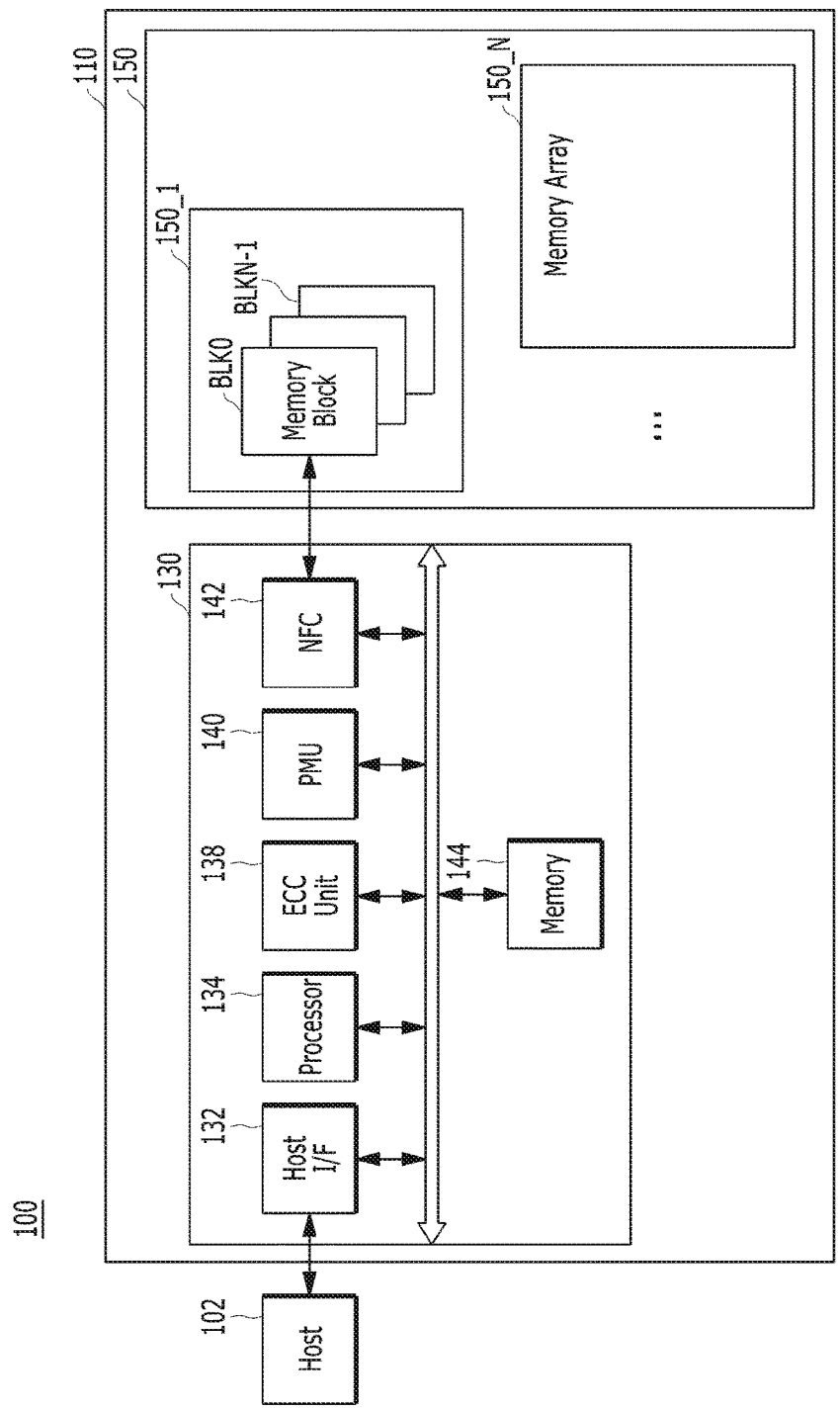
FIG. 1 is a diagram illustrating a data processing system including a memory system operatively coupled to a host, according to an embodiment of the present invention.

Although, various embodiments are described below in more detail with reference to the accompanying drawings, we note that the present invention may, however, be embodied in different forms and should not be construed as being limited only to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

We further note that in the following description, numerous specific details are set forth in for providing a thorough understanding of the present invention. However, as would be apparent to those skilled in the relevant art, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described with reference to the attached drawings.

Referring now to FIG. 1, a data processing system 100 including a memory system 110 is provided, according to an embodiment of the present invention.

The data processing system 100 may include a host 102 operatively coupled to the memory system 110.

For example, the host 102 may include a portable electronic device such as a mobile phone, an MP3 player and a laptop computer or a non-portable electronic device such as a desktop computer, a game player, a television (TV) and a projector.

The memory system 110 may operate in response to a request received from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

The memory system 110 may include a memory device 150 for storing data to be accessed by the host 102, and a controller 130 operatively coupled to the memory device 150 for controlling the storage of data in the memory device 150 and the transfer of stored data from the memory device 150 to the host 102.

The controller 130 and the memory device 150 may be integrated into a single semiconductor device. For instance, the controller 130 and the memory device 150 may be integrated into a single semiconductor device configured as a solid state drive (SSD). When the memory system 110 is used as a SSD, the operation speed of the host 102 that is electrically coupled with the memory system 110 may be significantly increased.

The controller 130 and the memory device 150 may be integrated into a single semiconductor device configured as a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted. The memory device 150 may store data provided from the host 102 during a write operation, and provide stored data to the host 102 during a read operation. The memory device 150 may include a plurality of memory arrays 150_1 to 150_N each including a plurality of memory blocks, for example, memory blocks BLK0 to BLKN−1. Each of the memory blocks BLK0 to BLKN−1 may include a plurality of pages (not shown). Each of the pages may include a plurality of memory cells coupled to a word line (WL) (See FIG. 3). The memory device 150 may be a nonvolatile memory device. For example, the nonvolatile memory device may be a flash memory. The flash memory may have a three-dimensional (3D) stack structure.

The controller 130 of the memory system 110 may control the memory device 150 in response to a request from the host 102. For example, upon receiving a read request from the host 102, the controller 130 may issue a read command and an address to the memory device for reading the data which are stored in the requested address in the memory device and may provide the data read from the memory device 150, to the host 102. Also, in response to a program request (also referred to as a write request) received from the host 102, the controller 130 may issue a write command, an address and write data and may control the operation of the memory device for storing the write data into the memory device 150. The write data are provided from the host 102 to the memory controller together with the write request. The controller 130 may control one or more operations of the memory device 150 including a read operation, a write operation and an erase operation. The controller 130 may also control one or more background operations of the memory device 150 including, for example, a wear leveling operation, and a garbage operation.

According to the illustrated embodiment of FIG. 1, the controller 130 may include a host interface unit 132, a processor 134, an error correction code (ECC) unit 138, a power management unit (PMU) 140, a NAND flash controller (NFC) 142, and a memory 144 operatively coupled to an internal bus.

The host interface unit 132 provides an interface between the host 102 and the controller 130. For example, the host interface unit 132 may receive and process requests, addresses and data provided from the host 102. The host interface unit 132 may also transmit read data from the memory device to the host 102. The host interface unit 132 may communicate with the host 102 through at least one of various well-known interface protocols such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI), an enhanced small disk interface (ESDI), and an integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130. Any suitable PMU may be employed.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 includes a flash memory, or more specifically, a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read operation, write operation, program operation and erase operation.

The memory 144 may be implemented with a volatile memory. For example, the memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control an operation of the memory system 110. For example, the processor 134 may control a write operation or a read operation for the memory device 150, in response to a write request or a read request from the host 102. The processor 134 may drive firmware, which is referred to as a flash translation layer (FTL), to control an operation of the memory system 110. In an embodiment, the processor 134 may be implemented with a microprocessor. In another embodiment the processor 134 may be implemented with a central processing unit (CPU).

A management unit (not shown) may be included in the processor 134 for performing a bad block management operation of the memory device 150. For example, the management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Reliable bad block management may reduce deterioration of the utilization efficiency and increase the reliability of the memory device 150.

Figure 2:
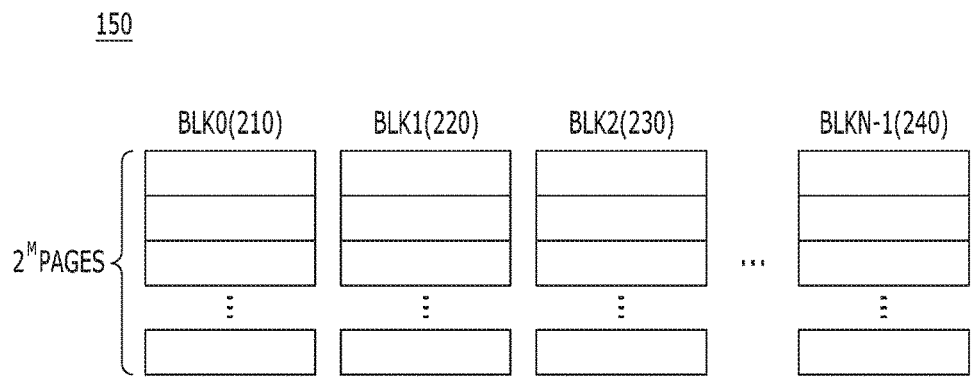
FIG. 2 is a diagram illustrating a configuration example of a memory device employed in the memory system of FIG. 1.

FIG. 2 is a diagram illustrating the memory device 150 of FIG. 1.

Referring to FIG. 2, the memory device 150 may include a plurality of memory blocks BLK0 to BLKN−1. For example, the memory device 150 may include zeroth to (N−1)$^{th}$ blocks 210 to 240. Each of the plurality of memory blocks 210 to 240 may include a plurality of pages. For example, each of the plurality of memory blocks 210 to 240 may include $2^M$ number of pages ($2^M$ PAGES), to which the present invention will not be limited. Each of the plurality of pages may include a plurality of memory cells which are electrically coupled to a word line.

The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. An MLC memory block may include a plurality of pages which are implemented with memory cells each capable of storing multi-bit data (e.g., two or more-bit data). The MLC memory block including a plurality of pages which are implemented with memory cells that are each capable of storing 3-bit data may be defined as a triple level cell (TLC) memory block.

Each of the plurality of memory blocks 210 to 240 may store data provided from the host device 102 during a write operation. Also, each of the plurality of memory bocks may provide stored data to the host 102 during a read operation.

Figure 3:
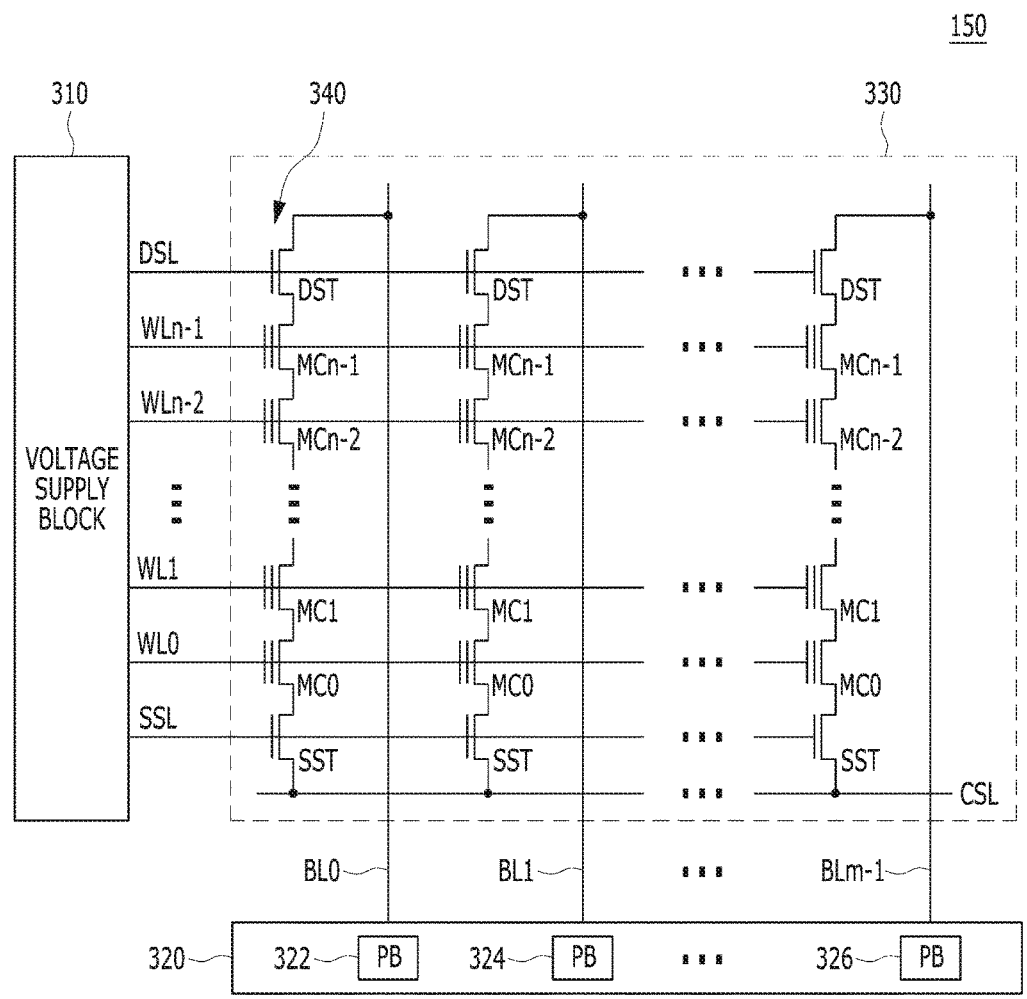
FIG. 3 is a diagram schematically illustrating a memory cell array circuit of a memory block in the memory device of FIG. 2.

FIG. 3 is a circuit diagram illustrating a memory block 330 in the memory device 150 of FIG. 2.

Referring to FIG. 3, the memory block 330 of the memory device 150 may include a plurality of cell strings 340 which are implemented into a memory cell array and are coupled to a plurality of bit lines BL0 to BLm−1. The cell string 340 of each column may include at least one drain select transistor DST and at least one source select transistor SST. A plurality of memory cells or memory cell transistors MC0 to MCn−1 may be coupled in series between the select transistors SST and DST. The respective memory cells MC0 to MCn−1 may be constructed by multi-level cells (MLC) each of which stores data information of a plurality of bits. Each of the cell strings 340 may be electrically coupled to a corresponding bit line among the plurality of bit lines BL0 to BLm−1. For reference, in FIG. 3, 'DSL' may denote a drain select line, and 'SSL' may denote a source select line, and 'CSL' may denote a common source line.

While FIG. 3 shows, as an example, the memory block 330 which is constructed by NAND flash memory cells, it is to be noted that the memory block 330 of the memory device 150 according to the embodiment is not limited to a NAND flash memory and may be implemented by a NOR flash memory, a hybrid flash memory in which at least two kinds of memory cells are combined or a one-NAND flash memory in which a controller is built in a memory chip. The operational characteristics of a semiconductor device may be applied to not only a flash memory device in which a charge storing layer is constructed by conductive floating gates but also a charge trap flash (CTF) in which a charge storing layer is constructed by a dielectric layer.

A voltage supply block 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply block 310 may be performed by the control of a control circuit (not shown). The voltage supply block 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by the control circuit, and may operate as a sense amplifier or a write driver according to an operation mode. For example, in the case of a verify/normal read operation, the read/write circuit 320 may operate as a sense amplifier for reading data from the memory cell array. Also, in the case of a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326. The memory device 150 may be implemented with a 2-dimensional or a 3-dimensional memory device.

Figure 4:
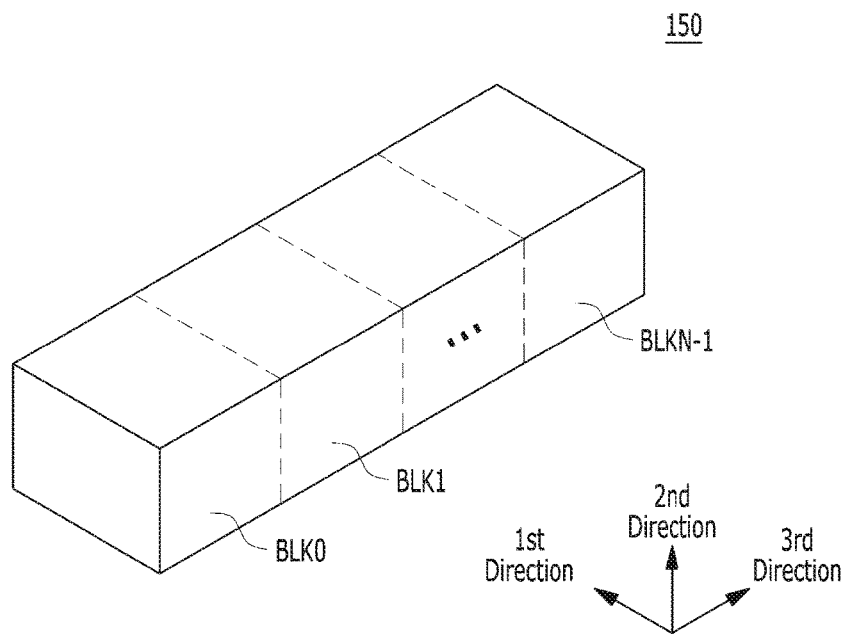
FIG. 4 is a diagram schematically illustrating a 3-D configuration of the memory blocks of the memory device of FIG. 2.

FIG. 4, illustrates a case where the memory device 150 is implemented with a 3-dimensional nonvolatile memory device, and includes a plurality of memory blocks BLK0 to BLKN−1. More specifically, FIG. 4 is a diagram illustrating the memory blocks BLK0 to BLKN−1 of the memory device 150 of FIG. 2 implemented in a 3-dimensional structure (or a vertical structure) which extends in first to third directions.

The respective memory blocks BLK0 to BLKN−1 included in the memory device 150 may include a plurality of NAND strings (such as NAND string 340 of FIG. 3), each NAND string extending in the second direction. The plurality of NAND strings may be spaced apart at regular intervals in the first direction and the third direction. Each NAND string may be coupled to a bit line (e.g., NAND string 340 coupled to bit line BL0 of FIG. 3). A common source line CSL may be coupled to the source select transistor SST of each NAND string of a block as shown in FIG. 3. A plurality of NAND strings forming a block may be coupled to at least one drain select line DSL coupled to the gate of each drain select transistor DST, at least one source select line SSL coupled to the gate of each source select transistor SST, a plurality of word lines WL1 to WLn−1, at least one dummy word line WL0 and a common source line CSL. Each NAND string may include a plurality of transistor structures e.g., SST, DST, and MC0 to MCn−1 (see FIG. 3).

Namely, among the plurality of memory blocks BLK0 to BLKN−1 of the memory device 150, the respective memory blocks BLK0 to BLKN−1 may be coupled to a plurality of bit lines, a plurality of drain select lines, a plurality of source select lines, a plurality of word lines, a plurality of dummy word lines and a plurality of common source lines, and accordingly, may include a plurality of NAND strings. Also, in the respective memory blocks BLK0 to BLKN−1, a plurality of NAND strings may be coupled to one bit line, and a plurality of transistors may be realized in one NAND string. A drain select transistor of each NAND string may be coupled to a corresponding bit line, and a source select transistor of each NAND string may be coupled to the common source line. (See FIG. 3). A plurality of memory cells MC1 to MCn−1 may be provided between the drain select transistor DST and the source select transistor SST of each NAND string. Namely, in the plurality of memory blocks BLK0 to BLKN−1 of the memory device 150, a plurality of memory cells may be realized in each of the memory blocks BLK0 to BLKN−1.

Figure 5:
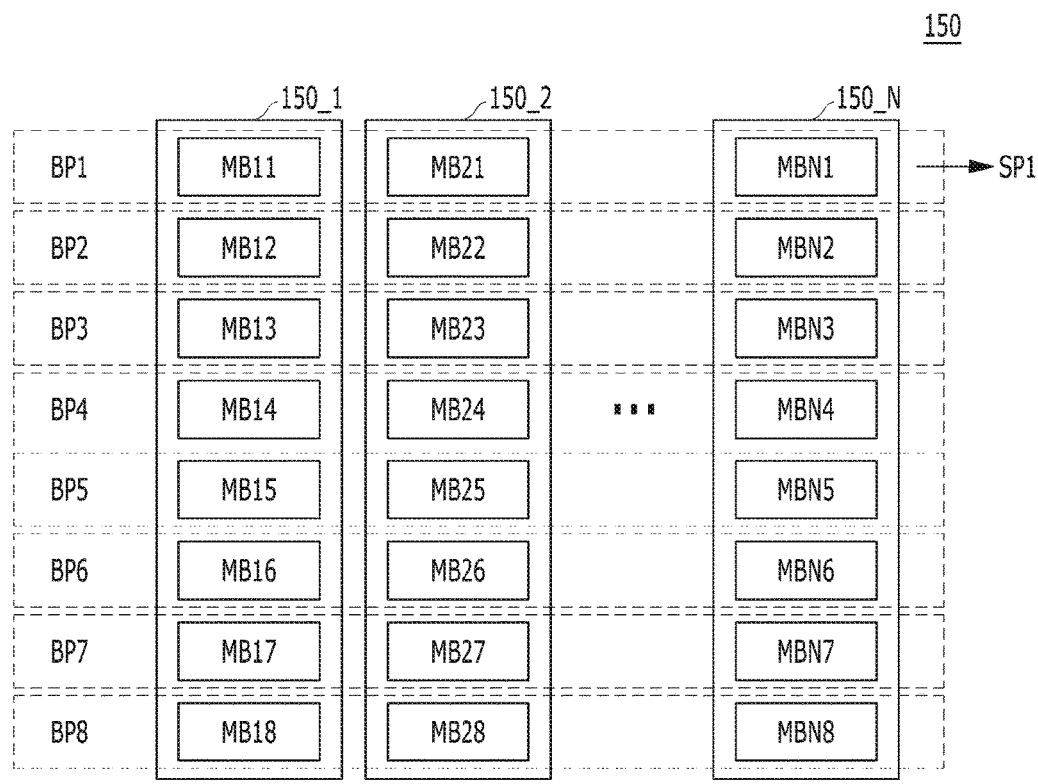
FIG. 5 illustrates a memory device, according to an embodiment of the present invention.
Figure 6A:
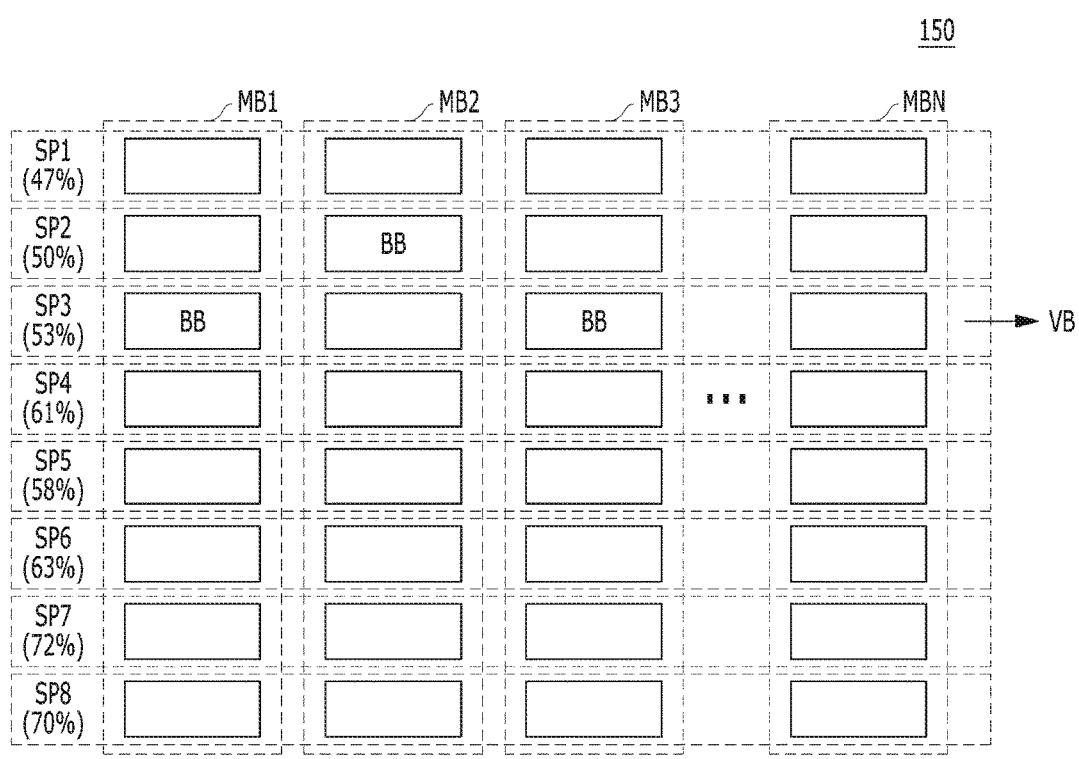
FIGS. 6A and 6B illustrate a garbage collection operation performed in the memory device of FIG. 5.
Figure 6B:
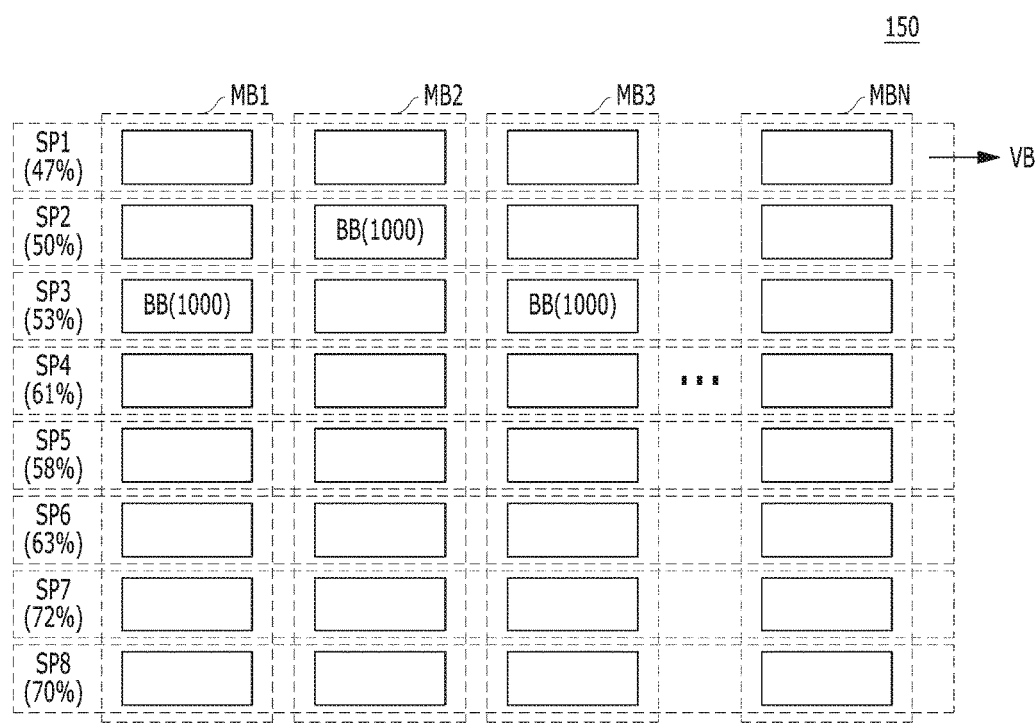
Figure 7:
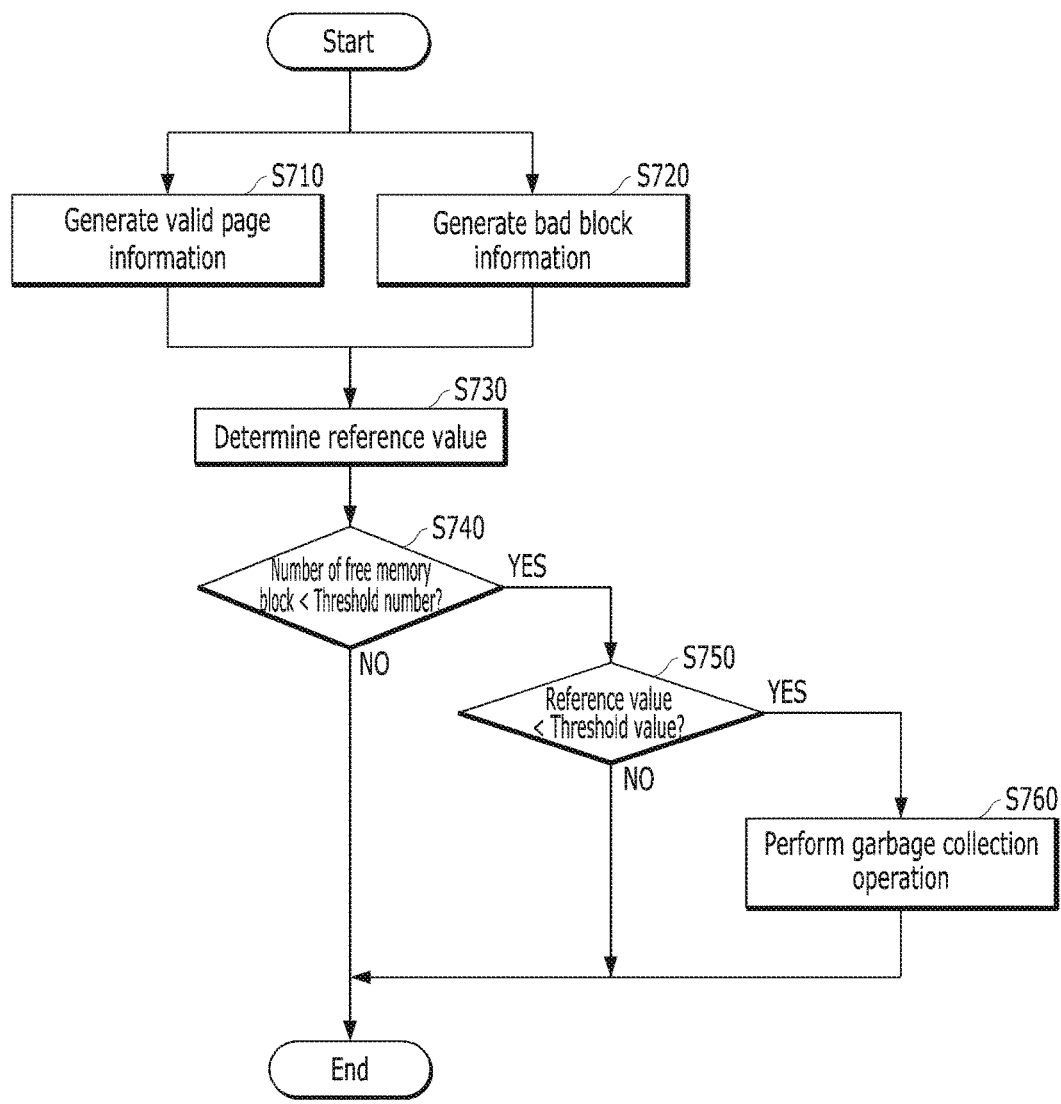
FIG. 7 is a flowchart illustrating a general operation of a memory system according to an embodiment of the present invention.

Described hereafter is a garbage collection operation performed in the memory device 150 under the control of the controller 130 in the memory system 110 of FIG. 1 in accordance with an embodiment of the present invention with reference to FIGS. 5 to 7.

FIG. 5 illustrates a memory device, according to an embodiment of the present invention. For the sake of convenience, description is provided by referring to the memory device 150 shown in FIG. 1.

Referring to FIG. 1, the memory device 150 may include a plurality of memory arrays 150_1 to 150_N. The memory arrays 150_1 to 150_N may be included in a single memory chip or in a plurality of memory chips. Each of the memory arrays 150_1 to 150_N may represent a single memory die. However, the memory device 150 illustrated in FIGS. 1 to 5 is just one embodiment of the present invention, and the concept and spirit of the present invention are not limited to it.

Each of the memory arrays 150_1 to 150_N may include a plurality of memory blocks MB, which are physical blocks of memory cells. FIG. 5 illustrates a case that each memory array includes eight memory blocks, and each of the eight memory blocks may be identified by a physical block address. The memory blocks may have block positions that are related to each other in the memory arrays 150_1 to 150_N. For example, memory blocks MB11 to MBN1 that are arranged in the first row may have a first block position BP1. In other words, the first block position BP1 represents that the memory blocks MB11 to MBN1 are arranged in similar physical positions in the inside of a corresponding memory array. In the embodiment of the present invention shown in FIG. 5, there are eight block positions BP1 to BP8. In short, the memory blocks are arranged in eight similar physical positions in the memory arrays 150_1 to 150_N.

The controller 130 of the memory system 110 in FIG. 1 may group the memory blocks having the same physical positions into super blocks SP in the memory blocks MB11 to MBN1. For example, the memory blocks MB11 to MBN1 having the first block position BP1 in the memory arrays 150_1 to 150_N may form a first super blocks SP1. Since the memory blocks included in one super block are arranged in the same physical position, they may have similar characteristics. Also, since an erase operation is performed on the basis of a super block, or since data are concurrently written in and/or read from the pages of the memory blocks included in one super block, the wearing level of the memory cells of the memory blocks in one super block may be similar.

In short, the memory cells of the memory blocks included in one super block may have similar possibility of deterioration, and since the kind of performed operations and the number of times that operations are performed are the same for the memory blocks of one super block, their state of wearing down may be similar. For example, when many operations are performed on the memory device 150 and thus the first memory block MB11 in a first super block SP1 wears down to become a bad block BB, the other memory blocks included in the first super block SP1, too, are highly likely to be decided as bad blocks as time passes.

Therefore, if a memory device performs operations on the basis of a super block, it needs to perform a garbage collection operation in consideration of the characteristics of the memory blocks originating from the similarity in the physical position and operation state of the memory blocks included in each super block. FIGS. 6A and 6B describes a garbage collection operation performed in the memory device 150 based on such characteristics of the memory blocks included in a super block.

FIGS. 6A and 6B illustrate a garbage collection operation performed in the memory device 150 of FIG. 5. The drawings simply show a plurality of memory blocks MB1 to MBN included in N memory arrays, and the garbage collection operation is performed on super blocks SP that are formed by grouping the memory blocks MB1 to MBN. In accordance with the embodiment of the present invention, the memory blocks MB1 to MBN are arranged in eight different physical positions in a corresponding memory array, and thus the memory blocks MB1 to MBN having similar physical positions form eight super blocks SP1 to SP8. However, the concept and spirit of the present invention are not limited to it.

Referring to FIG. 6A, it may be seen that the controller 130 of the memory system 110 in FIG. 1 performs a garbage collection operation based on valid page information of the super blocks SP1 to SP8 that are included in the memory device 150.

The valid page information may include the number of valid pages, which is a valid page count (VPC) value. In other words, since the controller 130 performs write, read, and erase operations on the basis of a super block, the garbage collection operation may be performed on the basis of a super block as well. For example, the controller 130 may determine the valid page information for a super block by counting the number of valid pages of the memory blocks included in the super block, and adding up the counted numbers. The sum of the valid page count number for each of the memory blocks in the super block is then the valid page information for the super block.

Subsequently, during the garbage collection operation, the controller 130 may compare the valid page information of the various super blocks, and select a super block which has the smallest valid page information value as a victim block VB. The data stored in the valid pages of the super block that is selected as the victim block VB may be copied into another super block, or a memory block, and then the super block that is selected as the victim block VB (also referred to hereinafter as the victim super block) may be erased. In this way, additional empty space for storing data may be attained. To sum up, empty space may be attained effectively by emptying the super block having the smallest number of valid pages.

Since the controller 130 performs basic operations on the basis of a super block, the memory blocks included in one super block may have similar number of valid pages. Therefore, the controller 130 may determine the valid page information by the valid region percentage of a representative memory block of the super block instead of counting the number of valid pages for every single memory block. The valid region percentage of a memory block is given by this formula:

(Vp/Va)*100, wherein Vp is the number of valid pages in a memory block and Va is the total number of all the pages in the memory block.

To take an example of first to third super blocks SP1 to SP3 among the super blocks SP illustrated in FIG. 6A, it may be seen that the valid page information is being determined from the valid region percentage of a representative memory block of each super block, which are 47%, 50%, and 53%, respectively. Assuming, as an example, that the total number of pages included in each memory block is 1000 and each super block includes 16 memory blocks (N=16), the counted valid page numbers VPC1 to VPC3 are as follows.

$VPC1 = N*(1000*47\%) = 7520$ $VPC2 = (N-1)*(1000*50\%) = 7500$ $VPC3 = (N-2)*(1000*53\%) = 7420$

In the above calculations, it is further assumed that the second memory block MB2 of the second super block SP2 and the first and third memory blocks MB1 and MB3 of the third super block SP3 are bad blocks BB, hence, the number of the pages corresponding to the decided bad blocks BB is subtracted from the counted valid page numbers. After all, since general operations may not be performed on the memory blocks decided as the bad blocks BB, they are excluded from the valid region. Therefore, based on the calculation results of the counted valid page numbers VPC1 to VPC3, the third super block SP3 having the smallest counted valid page number may be selected as a victim block VB during a garbage collection operation so that the data stored in the third super block SP3 are copied into another memory blocks and an erase operation is performed on the third super block SP3.

However, as described before, the memory blocks included in one super block are arranged in similar physical positions and the number of times that write, read, and/or erase operations are performed is the same among the memory blocks included in one super block. For this reason, the memory blocks of the third super block SP3 which includes two bad blocks BB, namely the first and third memory blocks MB1 and MB3, may wear down faster than the memory blocks of the first super block SP1 that has no bad blocks or the second super block SP2 that includes less bad blocks than the third super block SP3.

If the third super block SP3 is selected as a victim block VB and a copy operation and an erase operation are performed on the third super block SP3, the wearing level of the memory blocks of the third super block SP3, which is already poor, gets even worse, thus increasing the number of bad blocks BB. The increase in the number of bad blocks in the third super block SP3 may be more rapid than the increase in the number of bad blocks when the first super block SP1 or the second super block SP2 are selected as a victim block VB. Also, the controller 130 may disable super blocks including a predetermined reference number of bad blocks for the sake of operation efficiency so that the super blocks including the predetermined reference number of bad blocks are not accessed. In this case, the third super block SP3 including already two bad blocks BB may be disabled by the controller 130 as operations are performed.

A super block which includes more bad blocks has a lower valid region percentage, and the possibility that the super block is selected as a victim block VB is increased. However, as there are many bad blocks in a super block, it means that the remaining memory blocks in the super block may wear down faster than memory blocks in a super block that has no bad blocks or has fewer bad blocks. Hence, if the super block which has the greatest number of bad blocks is selected as a victim block, the wearing level may worsen, raising the possibility that the super bloc should be disabled. A garbage collection operation which takes into consideration these facts is described below in accordance with another embodiment of the present invention by referring to FIG. 6B.

Referring to FIG. 6B, the controller 130 of the memory system 110 in FIG. 1 performs a garbage collection operation based on the valid page information and bad block information of super blocks SP1 to SP8 that are included in the memory device 150.

As described earlier, the valid page information may include counted valid page numbers VPC of the super blocks SP1 to SP8. The valid page information, too, may represent the valid region percentage of the memory blocks included in the super blocks SP1 to SP8. The bad block information may include information on the memory blocks that are decided as bad blocks in the super blocks SP1 to SP8. The bad block information may represent the number of the memory blocks that are decided as bad blocks and their weight for each of the super blocks SP1 to SP8. Herein, the weight may correspond to the total number of the pages included in each memory block.

To take an example of the first to third super blocks SP1 to SP3 among the super blocks shown in FIG. 6B, it may be seen that the valid page information is managed by the valid region percentages of a representative memory block in each super block, which are 47%, 50% and 53%, respectively. Based on the valid page information, the counted valid page numbers VPC of the first to third super blocks SP1 to SP3 may be calculated, and a reference value RV for selecting a victim block may be calculated by adding the weight of the memory blocks that are decided as bad blocks to the counted valid page numbers VPC. When it is assumed that the total number of pages that are included in each memory block is 1000 and each super block includes 16 memory blocks (N=16), the respective reference values RV1 to RV3 for selecting a victim block for the first to third super blocks SP1 to SP3 are as follows.

$$RV1 = N(1000*47\%) = 7520$$

$$RV2 = (N-1)(1000*50\%) + 1000 = 8500$$

$$RV3 = (N-2)(1000*53\%) + 2*1000 = 9420$$

According to the calculation results of the reference values RV1 to RV3, the first super block SP1 having the smallest reference value is selected as a victim block VB during a garbage collection operation, and the data stored in the first super block SP1 are copied into other memory blocks and an erase operation for erasing all the memory blocks of the first super block SP1 may be performed. In short, according to the garbage collection operation in accordance with the embodiment of the present invention, the copy and erase operations may be performed on a super block having a relatively small number of bad blocks in consideration of not only the valid pages but also the bad block information. After all, a super block whose memory cells less wear down may be selected as a victim block, wear-leveling the memory device. When the reference values RV are calculated, the weight given to the bad blocks may be adjusted according to a reference for deciding a bad block or a reference for disabling a super block based on the decided bad block.

FIG. 7 is a flowchart illustrating a general operation of the memory system 110 in FIG. 1 according to an embodiment of the present invention.

1) Generate Valid Page Information (S710)

The controller 130 of the memory system 110 in FIG. 1 may set up a plurality of super blocks and generate valid page information for each of the super blocks. The controller 130 may generate the valid page information by counting the number of the valid pages of the memory blocks included in each super block. In an embodiment, the valid page information may be calculated using the valid region percentage of a representative memory block in each super block.

2) Generate Bad Block Information (S720)

The controller 130 may decide bad blocks among the memory blocks included in each of the super blocks, and generate information on the bad blocks. For example, the controller 130 may detect an error that has occurred in a page that is read from a memory block. If the detected error exceeds the number of bits that may be corrected by the ECC unit 138 of the controller 130 in FIG. 1, the controller 130 may decide the page as a failure page. When there are more than a predetermined reference number of failure pages in a memory block, the memory block may be decided as a bad block. The controller 130 may manage the number of bad blocks decided in each of the super blocks as the bad block information.

3) Set Reference Value (S730)

The controller 130 may determine a reference value RV for selecting a victim block during a garbage collection operation based on the valid page information generated at step S710 and the bad block information generated at step S720. The reference values RV of the super blocks may be obtained by reflecting weight into the bad block information and then adding the bad block information to the corresponding valid page information. Herein, the weight may correspond to the total value of the pages included in each bad block. The weight may be adjusted based on the reference that a super block is disabled based on the number of the bad blocks included therein.

4) Check Empty Space (S740)

The controller 130 may check the empty space where new data may be stored in the memory device 150. When the empty space is smaller than a predetermined threshold value, the controller 130 may perform a garbage collection operation. The empty space of the memory device 150 may correspond to the number of free memory blocks that are available for storing new data. When the number of the free memory blocks is smaller than the predetermined threshold number (YES at step S740), the operation of the memory system 110 may proceed to step S750.

5) Decide Victim Block (S750) and Perform Garbage Collection Operation (S760)

When the number of the free memory blocks is smaller than the predetermined threshold number (YES at step S740), the controller 130 may decide a victim block by comparing the calculated reference values RV of the super blocks obtained at step S730 with a predetermined threshold value. Alternatively, the reference values RV of the super blocks may be compared with each other, and a super block having a smallest value may be decided as a victim block. Referring to FIG. 7, when a reference value RV of a super block is smaller than the predetermined threshold value (YES at step S750), the operation of the memory system 110 may proceed to step S760. That is, at step S760, the super block is decided as a victim block, and a garbage collection operation may be performed on the super block.

As described above, a memory device that includes a plurality of super blocks obtained by grouping memory blocks according to their relevance of physical positions and performs an operation on the basis of a super block, and the garbage collection operation may be performed in consideration of not only the number of valid pages but also the number of bad blocks as well. Therefore, super blocks that include relatively more bad blocks, which means their wearing level is relatively higher, may be excluded from being candidates for a victim block, and thus more even wear-leveling may be achieved. Consequently, it becomes possible to achieve improved wear-leveling in a memory device while acquiring empty space by performing the garbage collection operation.

Hereafter, a data processing system and various electronic devices including the memory system 110 are described in more detail with reference to FIGS. 8 to 13.

Figure 8:
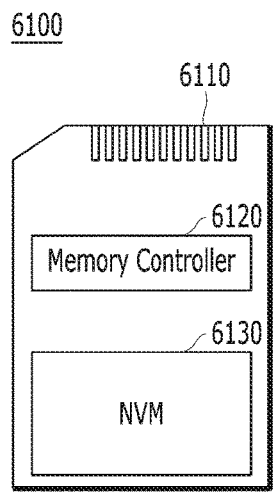
FIG. 8 is a diagram illustrating a memory card system, according to an embodiment of the present invention.

FIG. 8 is a diagram illustrating an example of a data processing system including a memory system, according to an embodiment of the present invention. More specifically, FIG. 8 illustrates a memory card system 6100.

Referring to FIG. 8, the memory card system 6100 may include a memory controller 6120, a memory device 6130, and a connector 6110.

The memory controller 6120 is connected with the memory device 6130 which may be implemented by a nonvolatile memory (NVM), and may access the memory device 6130. For example, the memory controller 6120 may control the read, write, erase and background operations of the memory device 6130. The memory controller 6120 may provide an interface between the memory device 6130 and a host, and may drive a firmware for controlling the memory device 6130. That is to say, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit.

The memory controller 6120 may communicate with an external device, for example, the host 102 described above with reference to FIG. 1, through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Accordingly, the memory system and the data processing system according to the embodiment may be applied to wired/wireless electronic appliances, in particular, a mobile electronic appliance.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 9:
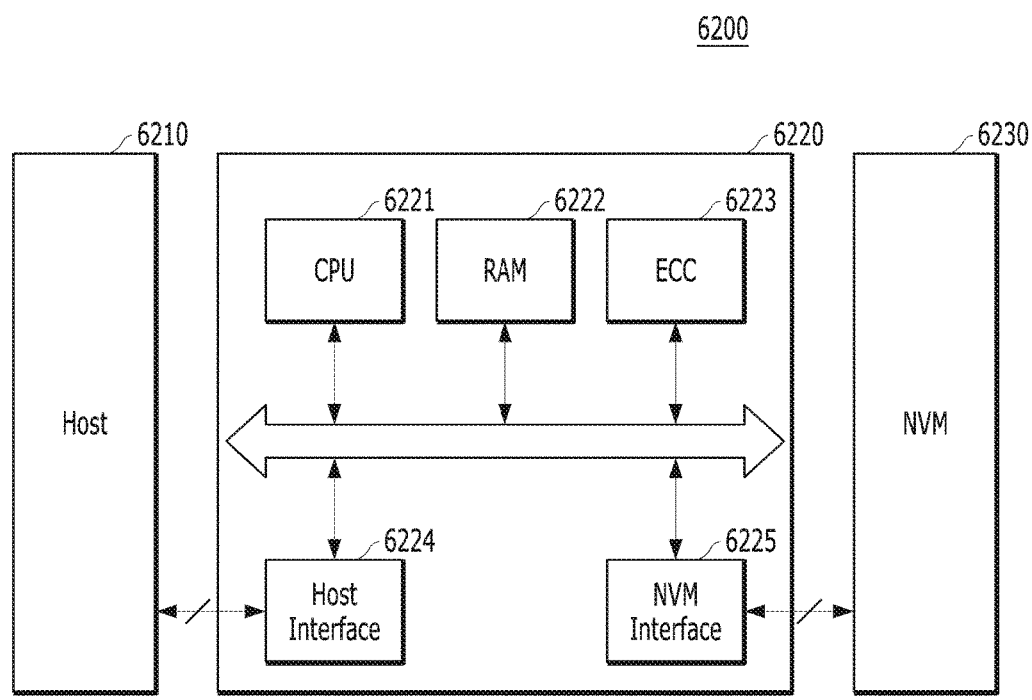
FIG. 9 is a block diagram illustrating a data processing system, according to an embodiment of the present invention.

FIG. 9 is a diagram illustrating an example of a data processing system 6200 including a memory system according to an embodiment of the present invention.

Referring to FIG. 9, the data processing system 6200 may include a memory device 6230 which is implemented by at least one nonvolatile memory (NVM) and a memory controller 6220 which controls the memory device 6230. The data processing system 6200 shown in FIG. 9 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control read, write and erase operations for the memory device 6230 in response to requests from a host 6210. The memory controller 6220 may include at least one of a central processing unit (CPU) 6221, a buffer memory, for example, a random access memory (RAM) 6222, an error correction code (ECC) circuit 6223, a host interface 6224, and a memory interface, for example, an NVM interface 6225, all operatively coupled to an internal bus.

The CPU 6221 may control operations for the memory device 6230 such as read, write, file system management, bad page management, and so forth. The RAM 6222 operates according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. Also, the ECC circuit 6223 may perform error correction encoding for data to be provided to the memory device 6230, and generates data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using one of various coded modulations such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as WIFI or long term evolution (LTE) is implemented, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, in particular, a mobile electronic appliance.

Figure 10:
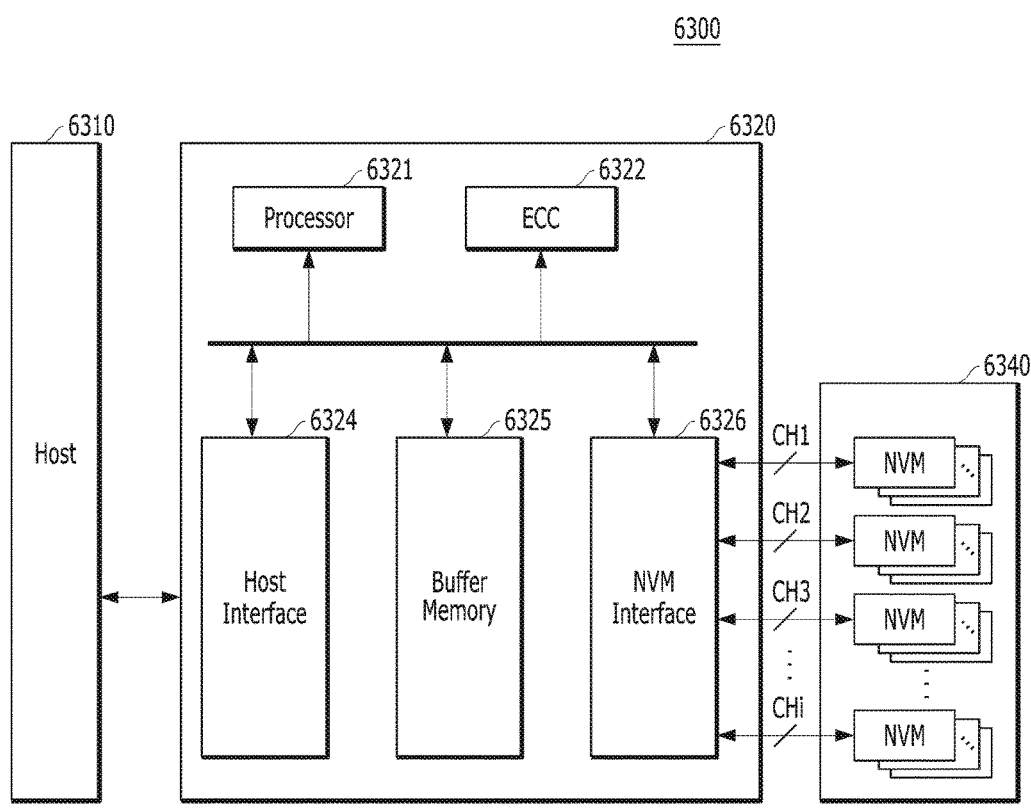
FIG. 10 is a block diagram illustrating a solid state drive (SSD), according to an embodiment of the present invention.

FIG. 10 is a diagram illustrating an example of a data processing system including a memory system according to an embodiment of the present invention. More specifically, FIG. 10 illustrates a solid state drive (SSD) 6300 including a memory system, according to an embodiment of the present invention.

Referring to FIG. 10, the SSD 6300 may include a memory device 6340 which may include a plurality of nonvolatile memories (NVMs), and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

The controller 6320 may be connected with the memory device 6340 through a plurality of channels CH1, CH2, CH3, . . . and CHi. The controller 6320 may include at least one processor 6321, a buffer memory 6325, an error correction code (ECC) circuit 6322, a host interface 6324, and a memory interface such as a nonvolatile memory (NVM) interface 6326.

The buffer memory 6325 temporarily stores data received from a host 6310 or data received from a plurality of nonvolatile memories NVMs included in the memory device 6340, or temporarily stores metadata of the plurality of nonvolatile memories NVM. For example, the metadata includes map data including mapping tables. The buffer memory 6325 may be implemented by a volatile memory such as, but not limited to, a dynamic random access memory (DRAM), a synchronous dynamic random access memory (SDRAM), a double data rate (DDR) SDRAM, a low power DDR (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 10, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310, and the nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system, for example, a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system, that is, at least one SSD 6300, in correspondence to the RAID level information of the write command received from the host 6310, among a plurality of RAID levels, that is, the plurality of SSDs 6300, and may output data corresponding to the write command, to the selected SSD 6300. Also, in the case of performing a read operation by receiving a read command from the host 6310, the RAID controller may select at least one memory system, that is, at least one SSD 6300, in correspondence to the RAID level information of the write command received from the host 6310, among the plurality of RAID levels, that is, the plurality of SSDs 6300, and may provide data outputted from the selected SSD 6300, to the host 6310.

Figure 11:
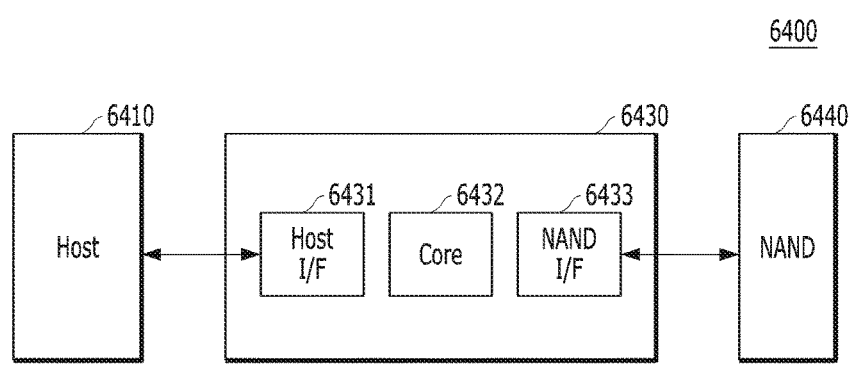
FIG. 11 is a block diagram illustrating an embedded multimedia card (eMMC), according to an embodiment of the present invention.

FIG. 11 is a diagram illustrating an embedded multimedia card (eMMC) 6400 including a memory system, according to an embodiment of the present invention.

Referring to FIG. 11, the eMMC 6400 may include a memory device 6440 which is implemented by at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 may be connected with the memory device 6440 through a plurality of channels. The controller 6430 may include a host interface 6431, at least one core 6432, and a memory interface, for example, a NAND interface 6433.

The core 6432 controls operations of the eMMC 6400, the host interface 6431 provides an interface function between the controller 6430 and a host 6410, and the NAND interface 6433 provides an interface function between the memory device 6440 and the controller 6430. For example, the host interface 6431 may be a parallel interface such as an MMC interface, as described above with reference to FIG. 1, and may be a serial interface such as an ultra-high speed (UHS)-I/UHS-II and a universal flash storage (UFS) interface.

Figure 12:
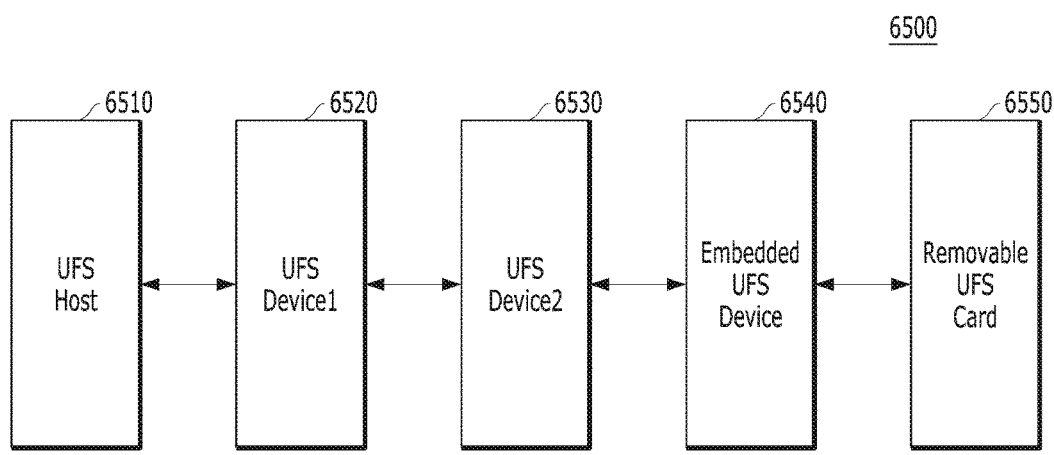
FIG. 12 is a block diagram illustrating a universal flash storage (UFS), according to an embodiment of the present invention.

FIG. 12 illustrates another example of a data processing system including a memory system according to an embodiment of the present invention. Specifically, FIG. 12 is a block diagram illustrating a universal flash storage (UFS) system 6500 to which the memory system according to an embodiment of the present invention is applied.

Referring to FIG. 12, the UFS system 6500 may include a UFS host 6510, a plurality of UFS devices 6520 and 6530, an embedded UFS device 6540, and a removable UFS card

6550. The UFS host 6510 may be an application processor of wired/wireless electronic appliances, in particular, a mobile electronic appliance.

The UFS host 6510, the UFS devices 6520 and 6530, the embedded UFS device 6540 and the removable UFS card 6550 may respectively communicate with external devices, that is, wired/wireless electronic appliances, in particular, a mobile electronic appliance, through a UFS protocol. The UFS devices 6520 and 6530, the embedded UFS device 6540 and the removable UFS card 6550 may be implemented as the memory system 110 described above with reference to FIG. 1, in particular, as the memory card system 6100 described above with reference to FIG. 8. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), a multimedia card (MMC), secure digital (SD), mini SD and Micro SD.

Figure 13:
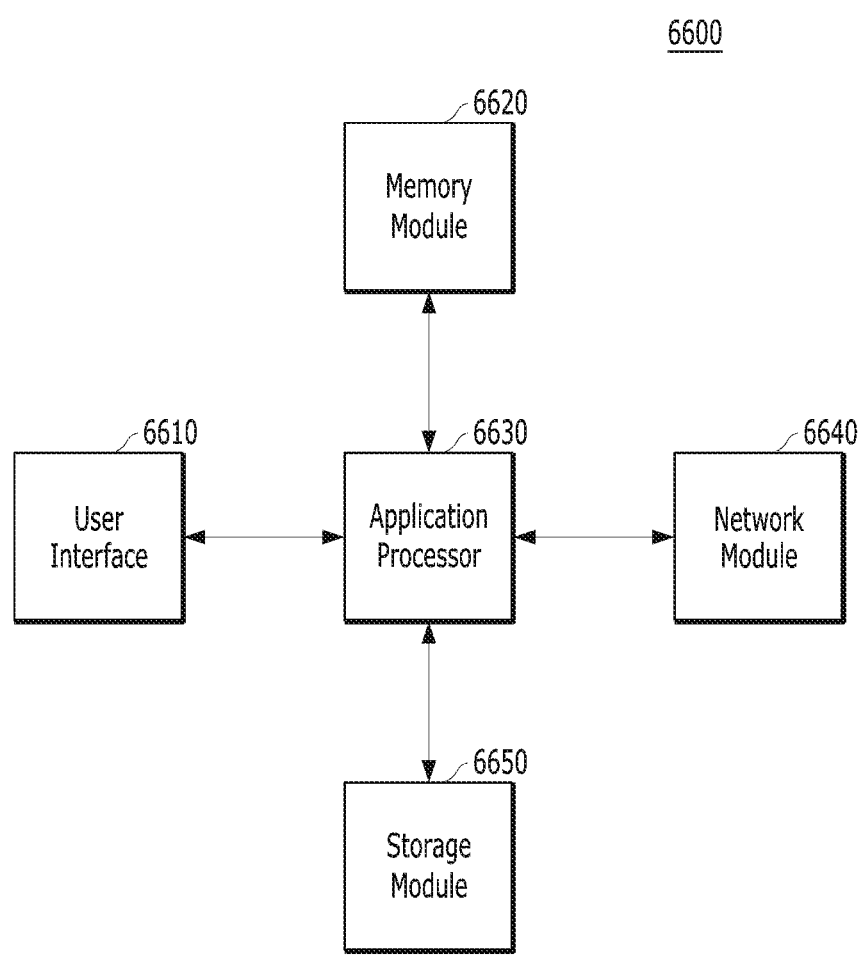
FIG. 13 is a block diagram illustrating a user system including a memory system, according to an embodiment of the present invention.

FIG. 13 illustrates yet another example of a data processing system including a memory system according to an embodiment of the present invention. Specifically, FIG. 13 is a block diagram illustrating a user system 6600 including a memory system, according to an embodiment of the present invention.

Referring to FIG. 13, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a ReRAM, a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), and so on, and may thereby communicate with wired/wireless electronic appliances, in particular, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6630, and transmit data stored therein, to the application processor 6630. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. Also, the storage module 6650 may be provided as a removable storage medium such as a memory card of the user system 6600 and an external drive. That is to say, the storage module 6650 may correspond to the memory system 110 described above with reference to FIG. 1, and may be realized as the SSD, eMMC and UFS described above with reference to FIGS. 10 to 12.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

In the case where the memory system 110 described above with reference to FIG. 1 is applied to the mobile electronic appliance of the user system 6600 according to an embodiment, the application processor 6630 controls general operations of the mobile electronic appliance, and the network module 6640 as a communication module controls wired/wireless communication with an external device, as described above. The user interface 6610 as the display/touch module of the mobile electronic appliance displays data processed by the application processor 6630 or supports input of data from a touch panel.

According to an embodiment of the present invention, a memory device may group memory blocks into super blocks according to their relevance of physical positions, perform an operation on the basis of a super block, and perform a garbage collection operation in consideration of not only the number of valid pages but also the number of bad blocks. In this way, super blocks, which include relatively many bad blocks, that is, which wear down more than other blocks, may be excluded from the selection of victim blocks, and eventually the difference in the wearing among super blocks may be reduced. In short, by performing the garbage collection operation, it becomes possible to achieve a more even wear-leveling while securing additional empty space in the memory device.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
   a memory device including a plurality of memory arrays, each of which includes a plurality of memory blocks; and
   a controller suitable for setting super blocks each including respective memory blocks that belong to two or more memory arrays among the plurality of the memory arrays and performing a garbage collection operation on the super blocks based on a valid page information and a wearing level of each super block;

wherein the controller performs the garbage collection operation by assigning a weight to a number of bad blocks included in the super blocks to produce a weighted number of the bad blocks, adding a number of valid pages included in the super blocks to the weighted number of the bad blocks, and selecting a super block having a smallest value among the added results as a victim block.

2. The memory system of claim 1, wherein the valid page information of each super block includes the number of valid pages and the wearing level of each super block is based on the number of bad blocks included in the super blocks, respectively.

3. The memory system of claim 2, wherein the controller performs the garbage collection operation on the super blocks by counting pages of the bad blocks as valid pages.

4. The memory system of claim 1, wherein the weight represents the total number of pages that are included in each of the bad blocks.

5. The memory system of claim 1, wherein the controller disables a super block that includes a number of bad blocks more than a threshold number.

6. The memory system of claim 5, wherein the controller adjusts the weight based on the threshold number.

7. The memory system of claim 1, wherein the controller simultaneously erases data of memory blocks included in each of the super blocks, and simultaneously writes data in respective pages of the memory blocks or simultaneously reads data from the respective pages.

8. The memory system of claim 1, wherein each of the super blocks includes memory blocks that are positioned at the same physical block positions in the more than two different memory arrays.

9. The memory system of claim 1, wherein the plurality of the memory arrays correspond to memory dies that are included in different memory chips.

10. A memory system, comprising:
a memory device including a plurality of memory arrays, each of which includes a plurality of memory blocks; and
a controller suitable for generating valid page information and bad block information for super blocks, each of which includes respective memory blocks that belong to two or more memory arrays among the plurality of the memory arrays, and determining reference values that are used for selecting a victim block for a garbage collection operation among the super blocks based on the valid page information and the bad block information;
wherein the controller generates the valid page information by counting the number of valid pages included in the super blocks and generates the bad block information by counting the number of bad blocks included in the super blocks; and
wherein the controller determines the reference values by assigning a weight to the counted number of the bad blocks so as to produce a weighted number of the bad blocks, and adding the counted number of the valid pages to the weighted number of the bad blocks.

11. The memory system of claim 10, wherein the weight represents the total number of pages that are included in each of the bad blocks.

12. The memory system of claim 10, wherein the controller determines an empty space of the memory device, and when the empty space is smaller than a threshold value, the controller compares the reference values, selects a super block having a smallest reference value among the reference values as the victim block, and performs the garbage collection operation on the victim block.

13. The memory system of claim 12, wherein the controller determines the empty space of the memory device by counting the number of free memory blocks that are available for storing new data in the memory device.

14. The memory system of claim 12, wherein the controller performs the garbage collection operation by copying and storing data that are stored in valid pages of the victim block into free memory blocks in the memory device and erasing data that are stored in the victim block.

15. The memory system of claim 10, wherein the controller reads data from the memory blocks, detects an error that occurs in the read data, and decides bad blocks based on the detected error.

16. A method for operating a memory system, comprising:
generating valid page information and bad block information of super blocks, each of which includes respective memory blocks that belong to different memory arrays;
wherein the generating of the valid page information includes counting the number of valid pages that are included in the super blocks and generating the bad block information includes counting the number of bad blocks that are included in the super blocks;
determining reference values that are used for selecting a victim block for a garbage collection operation among the super blocks based on the valid page information and the bad block information;
wherein the determining of the reference values includes:
assigning a weight to the counted number of the bad blocks so as to produce a weighted number of the bad blocks; and determining the reference values by adding the counted number of the valid pages to the weighted number of the bad blocks; and
performing the garbage collection operation on the super blocks based on the reference values.

* * * * *